(12) United States Patent
Yang

(10) Patent No.: US 10,204,932 B2
(45) Date of Patent: Feb. 12, 2019

(54) ARRAY SUBSTRATE, MANUFACTURING METHOD THEREOF, DISPLAY PANEL AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Lijuan Yang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 281 days.

(21) Appl. No.: 15/107,808

(22) PCT Filed: Oct. 19, 2015

(86) PCT No.: PCT/CN2015/092204
§ 371 (c)(1),
(2) Date: Jun. 23, 2016

(87) PCT Pub. No.: WO2017/000431
PCT Pub. Date: Jan. 5, 2017

(65) Prior Publication Data
US 2018/0197891 A1     Jul. 12, 2018

(30) Foreign Application Priority Data

Jun. 29, 2015 (CN) .......................... 2015 1 0374557

(51) Int. Cl.
*H01L 21/00* (2006.01)
*H01L 21/84* (2006.01)
(Continued)

(52) U.S. Cl.
CPC ............ *H01L 27/1244* (2013.01); *G03F 7/00* (2013.01); *G03F 7/0005* (2013.01);
(Continued)

(58) Field of Classification Search
CPC ....... H01L 2224/04105; H01L 2224/82; H01L 23/5389; H01L 27/124; H01L 27/1244
See application file for complete search history.

(56) References Cited

U.S. PATENT DOCUMENTS

2008/0157364 A1* 7/2008 Yang ..................... G02F 1/1345
257/741
2014/0030894 A1   1/2014 Shin

FOREIGN PATENT DOCUMENTS

CN        103034049 A    4/2013
KR        20010026120 A  4/2001
(Continued)

OTHER PUBLICATIONS

Machine translation of CN103034049, foreign reference cited in IDS and international search report.*
(Continued)

*Primary Examiner* — Jaehwan Oh
*Assistant Examiner* — John M Parker
(74) *Attorney, Agent, or Firm* — Ladas & Parry LLP

(57) ABSTRACT

An array substrate and a manufacturing method thereof are provided. The array substrate includes a display area (02) and a fan-out area (01) disposed at the periphery of the display area (02), the manufacturing method comprising forming a line pattern (212) disposed in at least one of the display area (02) and the fan-out area (01), wherein forming a line pattern disposed in at least one of the display area and the fan-out area includes the following steps: forming a metal layer (210); forming an intermediate pattern (211) by performing a first patterning process on the metal layer; and
(Continued)

forming the line pattern disposed in at least one of the display area (02) and the fan-out area (01) by performing a second patterning process on the intermediate pattern. The manufacturing methods provided by the respective embodiment of the present disclosure are capable of narrowing of the lines in the fan-out area, and compared with the existing one exposure method, can effectively reduce the risk of open-circuit and short-circuit.

14 Claims, 6 Drawing Sheets

(51) Int. Cl.
| | |
|---|---|
| *H01L 27/12* | (2006.01) |
| *G03F 7/00* | (2006.01) |
| *H01L 21/77* | (2017.01) |
| *G03F 7/42* | (2006.01) |
| *H01L 21/027* | (2006.01) |
| *G02F 1/1362* | (2006.01) |
| *H01L 27/32* | (2006.01) |

(52) U.S. Cl.
CPC .............. *G03F 7/0035* (2013.01); *G03F 7/42* (2013.01); *H01L 21/0274* (2013.01); *H01L 21/77* (2013.01); *H01L 27/12* (2013.01); *H01L 27/1262* (2013.01); *H01L 27/1288* (2013.01); *G02F 1/136286* (2013.01); *G02F 2001/136295* (2013.01); *H01L 27/3276* (2013.01)

(56) References Cited

FOREIGN PATENT DOCUMENTS

| KR | 20070014703 A | 2/2007 |
|---|---|---|
| KR | 101067863 B1 | 9/2011 |

OTHER PUBLICATIONS

Machine translation of KR20010026120, foreign reference cited in IDS and international search report.*

International Search Report and Written Opinion dated Mar. 31, 2016.

The First Chinese Office Action dated Jul. 3, 2017; Appln. No. 201510374557.6.

* cited by examiner

ARRAY SUBSTRATE, MANUFACTURING METHOD THEREOF, DISPLAY PANEL AND DISPLAY DEVICE

TECHNICAL FIELD

At least one embodiment of the present disclosure relates to an array substrate, a manufacturing method thereof, a display panel and a display device.

BACKGROUND

A liquid crystal display (LCD) panel in a thin-film transistor liquid crystal display (TFT-LCD) has the advantages of good brightness, high contrast, low power consumption, small size, light weight, etc. Meanwhile, the LCD panel has the advantages of mass production, high automation degree, low cost of raw materials and wide development space, and is a hotspot in global economic growth in the 21st century.

The LCD panel comprises an active display area and a peripheral circuit area. A plurality of pixels are disposed in the active display area to form a pixel array. A peripheral circuit is disposed in the peripheral circuit area. For instance, each pixel includes a thin-film transistor (TFT) and a pixel electrode connected with the TFT. For instance, each pixel is encircled by two adjacent scanning lines and two adjacent data lines. Generally, the scanning lines and the data lines extend from the active display area to the peripheral circuit area and are electrically connected with a driver chip through the peripheral circuit. In general, the driver chip has specified size design, and the peripheral circuit is connected with one end of the scanning line and one end of the data line with an area provided with the driver chip to form a fan-out area.

With the development of display technology, display products need to adopt a narrow-bezel design to achieve perfect visual effect, so the line width and the line spacing must be reduced. However, as the conventional wiring design has reached a resolution limit of an exposure machine, if the line width and the line spacing are further reduced, the risk of breakage and short circuit of lines can be caused in the manufacturing process.

Moreover, it has been found that by using a same pattern on a mask during a manufacturing process, lines formed in a pixel area after photolithography are thinner than lines formed in a fan-out area after photolithography. The reasons are as follows: (1) in the aspect of layout, the lines in the pixel area are relatively sparse while the lines in the fan-out area are relatively dense. Taking positive photoresist as an example, in the process of forming lines, photoresist among the lines are subjected to exposure and removed by development. Thus, in the process of development, as the lines in the fan-out area are dense, the photoresist among the lines is difficult to remove, so the lines in the fan-out area are relatively wide. (2) In the aspect of luminous intensity distribution, the lines in the fan-out area are dense. Taking positive photoresist as an example, transmissive regions on a mask correspond to gaps between the lines. When light is irradiated to the mask, the transmissive regions of the mask are equivalent to slits and constitute a transmissive diffraction grating. When the wiring is denser and the number of the slits is larger, the grating constant is smaller, and bright fringes formed by grating diffraction are brighter and thinner. Therefore, the size of an exposure area is reduced, and hence the width of the lines in the fan-out area is increased. (3) In the aspect of imaging, the exposure machine is actually an imaging optical system. Each imaging system has cut-off frequency, and the system cannot run through an object (an image on the mask) spectrum higher than the cut-off frequency. As for the image on the mask, when the lines are denser and the number of high-frequency components is larger, more information will be cut-off in the process of imaging, and hence the difference between the exposed area of the photoresist and the image on the mask can be larger.

Therefore, how to achieve the narrowing of the lines in the fan-out area is the technical problem to be solved in the art in view of the phenomena that: the resolution of the current exposure machine has reached limit and there is bottleneck in the manufacturing process of fan-out areas of narrow-bezel and high-PPI products.

SUMMARY

At least one embodiment of the present disclosure provides an array substrate and a manufacturing method thereof, so as to effectively reduce the risk of open-circuit and short-circuit At least one embodiment of the present disclosure provides a method for manufacturing an array substrate, the array substrate including a display area and a fan-out area disposed at the periphery of the display area, the manufacturing method including forming a line pattern disposed in at least one of the display area and the fan-out area, wherein forming a line pattern disposed in at least one of the display area and the fan-out area includes the following steps:

forming a metal layer;

forming an intermediate pattern by performing a first patterning process on the metal layer; and forming the line pattern disposed in at least one of the display area and the fan-out area by performing a second patterning process on the intermediate pattern.

For example, in the manufacturing method provided by the embodiment of the present disclosure, the density of lines in the intermediate pattern is less than the density of lines in the line pattern.

For example, in the manufacturing method provided by the embodiment of the present disclosure, a width of each line in the intermediate pattern is greater than a width of each line in the line pattern.

For example, in the manufacturing method provided by the embodiment of the present disclosure, wherein the intermediate pattern includes a partially formed line pattern.

For example, in the manufacturing method provided by the embodiment of the present disclosure, the step of forming the intermediate pattern by performing the first patterning process on the metal layer includes:

forming a first photoresist layer on the metal layer;

performing an exposure on the first photoresist layer via a first mask plate;

performing a development on the first photoresist layer obtained after the exposure;

performing a first etching on the metal layer; and obtaining the intermediate pattern by stripping off the residual photoresist.

For example, in the manufacturing method provided by the embodiment of the present disclosure, the step of forming the line pattern disposed in at least one of the display area and the fan-out area by performing the second patterning process on the intermediate pattern includes:

forming a second photoresist layer on the intermediate pattern;

performing an exposure on the second photoresist layer via a second mask plate;

performing a development on the second photoresist layer obtained after the exposure;

performing a second etching on the intermediate pattern; and obtaining the line pattern disposed in at least one of the display area and the fan-out area by stripping off the residual photoresist.

For example, in the manufacturing method provided by the embodiment of the present disclosure, the array substrate further includes a source/drain layer; and the line pattern disposed in at least one of the display area and the fan-out area is formed in a same layer with a source electrode and a drain electrode in the source/drain layer.

For example, in the manufacturing method provided by the embodiment of the present disclosure, the array substrate further includes a gate layer; and the line pattern disposed in at least one of the display area and the fan-out area is formed in a same layer with a gate electrode in the gate layer.

For example, in the manufacturing method provided by the embodiment of the present disclosure, the first photoresist layer is a positive photoresist layer, an area of the first mask plate corresponding to a portion of the metal layer for forming the intermediate pattern is a light-shielding area, and an area of the first mask plate corresponding to a portion of the metal layer to be removed is a transmissive area;

Or the first photoresist layer is a negative photoresist layer, the area of the first mask plate corresponding to a portion of the metal layer for forming the intermediate pattern is a transmissive area, and the area of the first mask plate corresponding to a portion of the metal layer to be removed is a light-shielding area.

For example, in the manufacturing method provided by the embodiment of the present disclosure, the second photoresist layer is a positive photoresist layer, an area of the second mask plate corresponding to a portion of the intermediate pattern for forming the line pattern is a light-shielding area, and an area of the second mask plate corresponding to a portion of the intermediate pattern to he removed is a transmissive area;

or if the second photoresist layer is a negative photoresist layer, the area of the second mask plate corresponding to a portion of the intermediate pattern for forming the line pattern is a transmissive area, and the area of the second mask plate corresponding to a portion of the intermediate pattern to be removed is a light-shielding area.

For example, in the manufacturing method provided by the embodiment of the present disclosure, in the step of performing a first etching on the metal layer, the etching method includes dry etching or wet etching.

For example, in the manufacturing method provided by the embodiment of the present disclosure, in the step of performing the second etching on the intermediate pattern, the etching method includes dry etching or wet etching.

At least one embodiment of the present disclosure further provides an array substrate, manufactured by the manufacturing method provided by at least one embodiment of the present disclosure.

At least one embodiment of the present disclosure further provides a display panel, including any array substrate described above.

For example, in the display panel provided by the embodiment of the present disclosure, the display panel includes a liquid crystal display panel or an organic light-emitting diode display panel.

At least one embodiment of the present disclosure further provides a display device, including any display panel described above.

BRIEF DESCRIPTION OF THE DRAWINGS

Simple description will be given below to the accompanying drawings of the embodiments to provide a more clear understanding of the technical proposals of the embodiments of the present disclosure. Obviously, the drawings described below only involve some embodiments of the present disclosure but are not intended to limit the present disclosure.

Figure 1A:
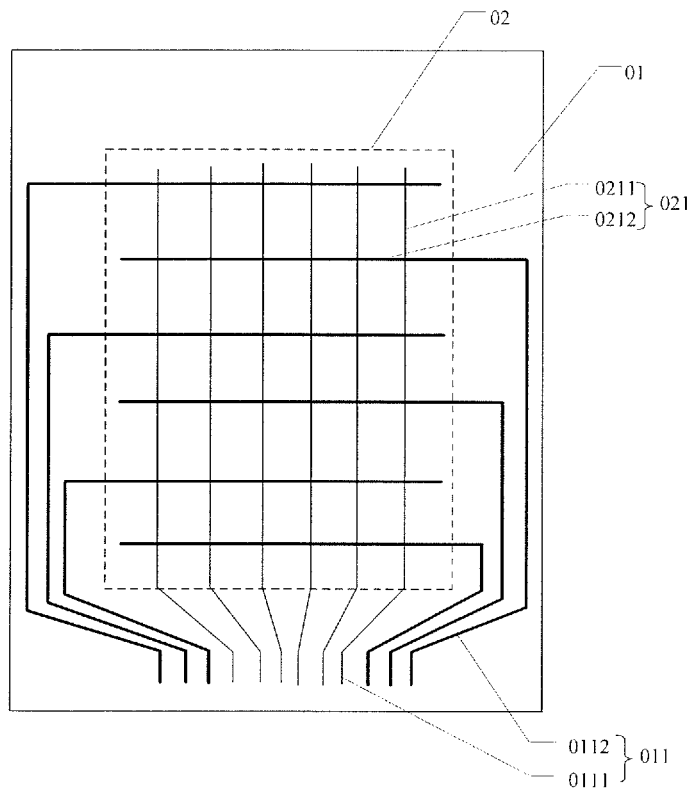
FIG. 1a is a schematic diagram illustrating the area division in an array substrate provided by one embodiment of the present disclosure and illustrating a line pattern in an area.

Reference numerals of the accompanying drawings:

200—base substrate; 210—metal layer; 220—first photoresist layer; 221—first photoresist-retained portion; 230—first mask plate; 211—intermediate pattern; 240—second photoresist layer; 241—second photoresist-retained portion; 250—second mask plate; 212—final pattern (line pattern); 01—fan-out area; 02—display area; 022—gate electrode; 023—source electrode; 024—drain electrode.

DETAILED DESCRIPTION

For more clear understanding of the objectives, technical proposals and advantages of the embodiments of the present disclosure, clear and complete description will be given below to the technical proposals of the embodiments of the present disclosure with reference to the accompanying drawings of the embodiments of the present disclosure. Obviously, the preferred embodiments are only partial embodiments of the present disclosure but not all the embodiments. All the other embodiments obtained by those skilled in the art without creative efforts on the basis of the embodiments of the present disclosure illustrated shall fall within the scope of protection of the present disclosure.

Figure 1B:
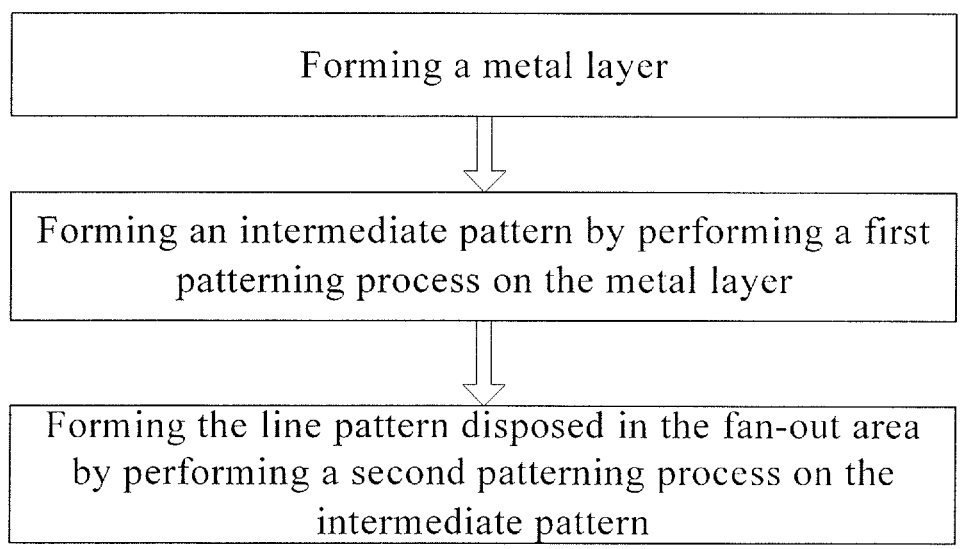
FIG. 1b is a flowchart illustrating forming lines in a fan-out area in a method for manufacturing an array substrate provided by an embodiment of the present disclosure.

At least one embodiment of the present disclosure provides a method for manufacturing an array substrate. The array substrate includes a display area 02 and a fan-out area 01 disposed at the periphery of the display area (the display area 02 and the fan-out area 01 are as shown in FIG. 1a). The manufacturing method includes forming a line pattern disposed in the fan-out area. As illustrated in FIG. 1b, the step of forming lines disposed in the fan-out area includes:

forming a metal layer;

forming an intermediate pattern by performing a first patterning process on the metal layer; and forming the line pattern disposed in the fan-out area by performing a second patterning process on the intermediate pattern.

As described above, due to the limitation on the resolution of the exposure machine, lines in fan-out areas of narrow-bezel and high-PPI products cannot achieve narrowing production. If patterns of which the line width and/or the line spacing is less than the exposure accuracy limit of the exposure machine are formed by one exposure of the exposure machine, the risk of breakage and short circuit of lines can be caused in the manufacturing process.

In the embodiment of the present disclosure, high-density lines in the fan-out area are formed by two patterning processes. The two patterning processes are performed by adopting two independent masks with low pattern density, for exposure, so that the requirement on the exposure accuracy of the exposure machine is reduced, and hence the quality of formed patterns after exposure is higher. Moreover, the embodiment of the present disclosure can achieve the narrowing of the lines in the fan-out areas. Compared with the means of adopting one exposure in the prior art, the risk of breakage and short circuit of lines can be effectively reduced.

As illustrated in FIG. 1a, for instance, a line pattern 021 in the display area 02 includes a transverse pattern of transverse gate lines 0212 and a vertical pattern of data lines 0211. The plurality of gate lines 0212 and the plurality of data lines 0211 are intersected with each other and insulated from each other. For instance, a line pattern 011 in the fan-out area 01 includes a first line pattern 0111 and a second line pattern 0112. For instance, lines in the first line pattern 0111 are respectively electrically connected with the data lines 0211 in the pattern of the data lines 0211, and lines in the second line pattern 0112 are respectively electrically connected with the gate lines in the pattern of the gate lines 0212. It should be noted that examples are only given here for the convenience of understanding, but the present disclosure is not limited thereto. For instance, the line pattern in the fan-out area may also be electrically connected with touch electrodes in the display area. The electrical connection, for instance, refers to the direct electrical connection of components in the same layer or the electrical connection of components in different layers via through holes.

For instance, in the method for manufacturing the array substrate provided by an embodiment of the present disclosure, the density of lines in the intermediate pattern is less than the density of lines in the line pattern. The density of the lines, for instance, refers to the number of the lines within a certain area. The certain area, for instance, refers to the area of the display area or the fan-out area.

For instance, in the method for manufacturing the array substrate provided by one embodiment of the present disclosure, the width of each line in the intermediate pattern is greater than the width of each line in the line pattern. For instance, each line in the intermediate line pattern disposed in the fan-out area is manufactured into two lines by the second patterning process, so that a final line pattern (an objective line pattern) can be obtained.

For instance, in the method for manufacturing the array substrate provided by an embodiment of the present disclosure, the intermediate pattern includes a partially formed line pattern.

Figure 2A:
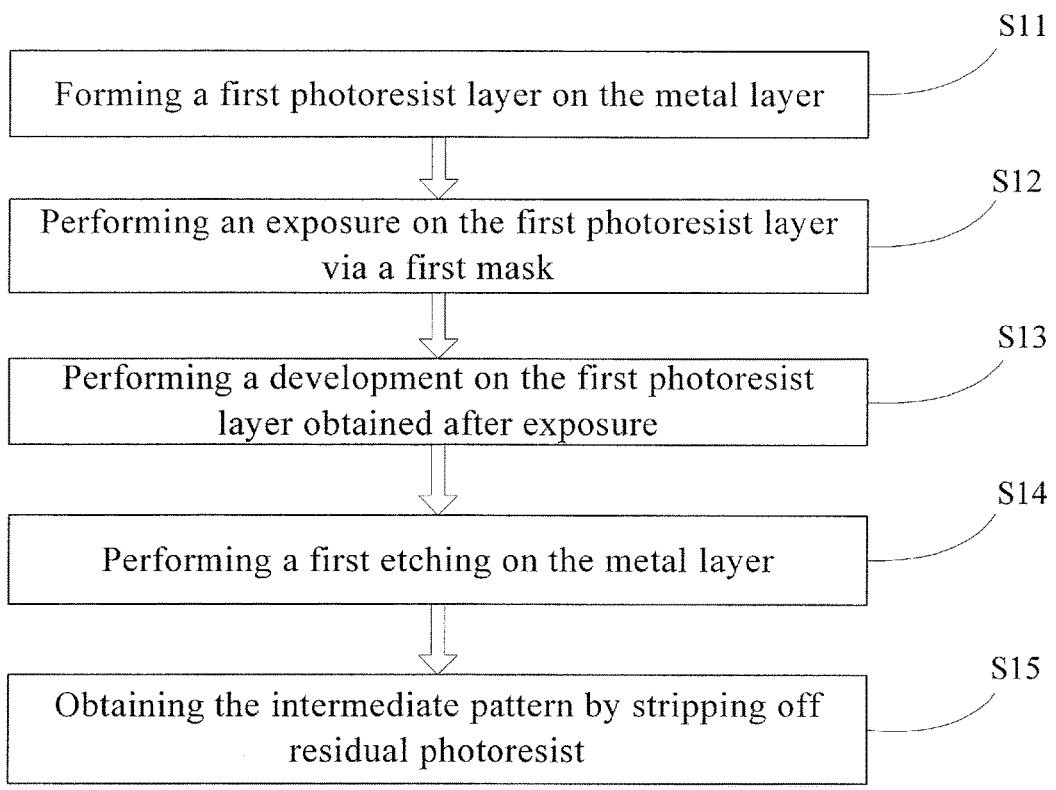
FIGS. 2a and 2b are flowcharts respectively illustrating forming an intermediate pattern and final lines in the method for manufacturing the array substrate provided by an embodiment of the present disclosure.

For instance, as illustrated in FIG. 2a, the step of forming the intermediate pattern by performing the first patterning process on the metal layer includes:

S11: forming a first photoresist layer on the metal layer;
S12: performing an exposure on the first photoresist layer via a first mask plate;
S13: performing a development on the first photoresist layer obtained after the exposure;
S14: performing a first etching on the metal layer; and
S15: obtaining the intermediate pattern by stripping off residual photoresist.

Figure 2B:
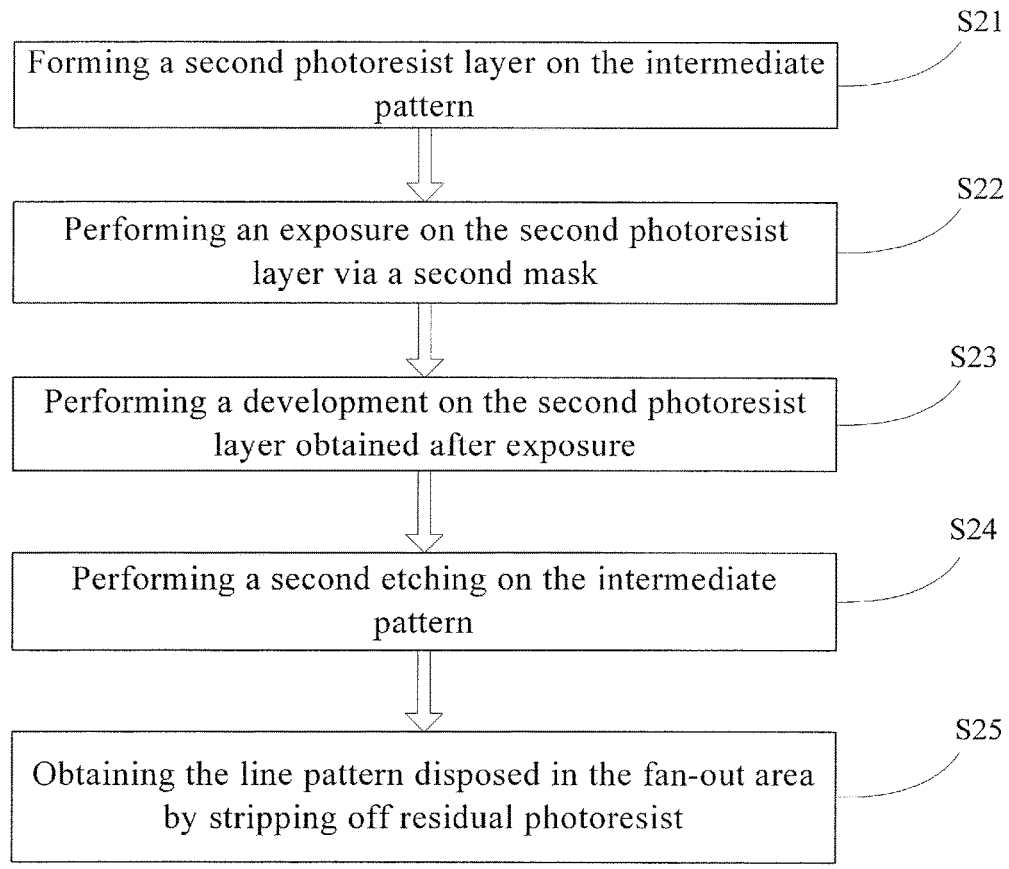

For instance, as illustrated in FIG. 2b, the step of forming the line pattern disposed in the fan-out area by performing the second patterning process on the intermediate pattern includes:

S21: forming a second photoresist layer on the intermediate pattern;
S22: performing an exposure on the second photoresist layer via a second mask plate;
S23: performing a development on the second photoresist layer obtained after the exposure;
S24: performing a second etching on the intermediate pattern; and
S25: obtaining the line pattern disposed in the fan-out area by stripping off residual photoresist.

In the embodiment, the intermediate pattern and the final line pattern are sequentially formed by photolithography.

Figure 2C:
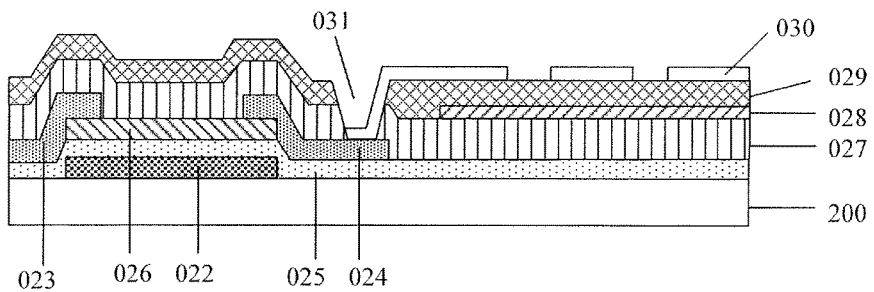
FIG. 2c is a schematic sectional view of an array substrate.

Moreover, as illustrated in FIG. 2c, the array substrate further includes a source/drain layer. The line pattern disposed in the fan-out area is formed in the same layer with a source electrode 023 and a drain electrode 024 in the source/drain layer.

For instance, the array substrate can be as shown in FIG. 2c. The array substrate includes a base substrate 200 having a display area 02 and a fan-out area 01 (with reference to FIG. 1a). For instance, the display area 02 is encircled by the fan-out area 01. For instance, the fan-out area is a peripheral circuit area or the fan-out area is disposed in a peripheral circuit area. The array substrate 200 includes a gate electrode 022 disposed in the display area 02 of a base substrate 101, a gate insulating layer 025 covering the gate electrode 022, an active layer (semiconductor layer) 026 being disposed on the gate insulating layer 025 and corresponding to the position of the gate electrode 022, a source electrode 023 and a drain electrode 024 arranged on the active layer 026 and disposed on both sides of the active layer 026, a first insulating layer 027 covering the entire base substrate 200, a common electrode 028 disposed on the first insulating layer 027 in the display area 02, a second insulating layer 029 disposed on the common electrode 028, and a pixel electrode 030 disposed on the second insulating layer 029 in the display area 02. The pixel electrode 030 is electrically connected with the drain electrode 024 via a through hole 031.

It should be noted that description is given to the above embodiments of the present disclosure by taking the advanced super dimension switch (ADS) mode array substrate as shown in FIG. 2c as an example, but the type of the array substrate in respective embodiments of the present disclosure is not limited thereto. For instance, the array substrate may also be an ADS mode array substrate having another structure or an array substrate of other modes. For instance, the array substrate may also adopt the mode such as twisted nematic (TN), vertical alignment (VA) and in-plane switching (IPS). The present disclosure is not limited thereto.

In general, the lines in the fan-out area are mainly signal lines, and the main function of the signal lines is to connect source/drain electrode metal and a driver chip. Therefore, in an embodiment of the present disclosure, the source/drain electrodes in the array substrate and the lines in the fan-out area may be arranged in the same layer.

Or, the array substrate further includes a gate layer, and the line pattern disposed in the fan-out area and a gate electrode in the gate layer are formed in the same layer. For instance, the gate electrode may be formed in the same layer with gate lines. But the present disclosure is not limited thereto.

In a conventional TFT-LCD process, the material of the gate electrode is also usually metal. The line pattern in the fan-out area may also be arranged in the same layer with the gate electrode. Subsequently, the lines in the fan-out area are electrically connected with the source/drain metal via through holes.

In an embodiment of the present disclosure, the first photoresist layer adopted in the first patterning process and the second photoresist layer adopted in the second patterning process may be positive photoresist layers and may also be negative photoresist layers. The following embodiments may be the same in this regard.

In a case that the first photoresist layer is a positive photoresist layer, an area of the first mask plate corresponding to a portion of the metal layer for forming the intermediate pattern is a light-shielding area, and an area of the first mask plate corresponding to a portion of the metal layer to be removed is a transmissive area;

Or, in a case that the first photoresist layer is a negative photoresist layer, the area of the first mask plate corresponding to the portion of the metal layer for forming the intermediate pattern is a transmissive area, and the area of the first mask plate corresponding to the portion of the metal layer to be removed is a light-shielding area.

Correspondingly, in a case that the second photoresist layer is a positive photoresist layer, an area of the second mask plate corresponding to a portion of the intermediate pattern for forming the line pattern is a light-shielding area, and an area of the second mask plate corresponding to a portion of the intermediate pattern to be removed is a transmissive area;

Or, in a case that the second photoresist layer is a negative photoresist layer, the area of the second mask plate corresponding to the portion of the intermediate pattern for forming the line pattern is a transmissive area, and the area of the second mask plate corresponding to the portion of the intermediate pattern to be removed is a light-shielding area.

Moreover, the etching methods adopted in the first etching process and the second etching process are not limited in the at least one embodiment of the present disclosure, as long as the layer etching can be completed and the desired process pattern can be obtained.

For instance, in the step of performing the first etching on the metal layer, the etching method may include dry etching or wet etching; and in the step of performing the second etching on the intermediate pattern, the etching method may also include dry etching or wet etching.

Detailed description will be given below to the method for manufacturing the array substrate provided by an embodiment of the present disclosure with reference to FIGS. 3a to 3i. The manufacturing process of the line pattern disposed in the fan-out area in the embodiment of the present disclosure includes the following steps.

Figure 3A:
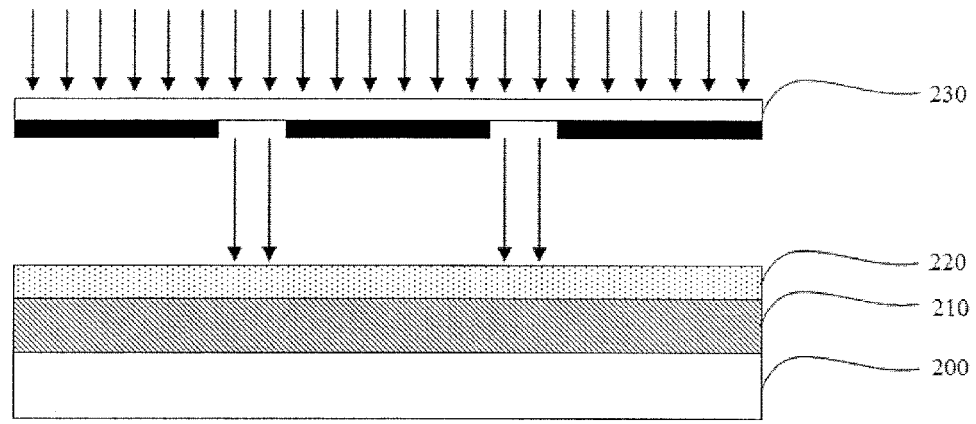
FIGS. 3a to 3i are schematic sectional views illustrating the process of forming lines in a fan-out area in the method for manufacturing the array substrate provided by an embodiment of the present disclosure.

Firstly, a metal layer 210 (e.g., a metal layer for forming gate electrodes or source/drain electrodes of TFTs) and a first photoresist layer 220 are formed on a surface of a base 200 in sequence, and then, the first photoresist layer 220 is subjected to an exposure via a first mask plate 230, as shown in FIG. 3a.

For instance, positive photoresist is adopted in the embodiment. After the positive photoresist is exposed, photochemical reaction occurs in an irradiated portion during the exposure. And, for example, the exposed positive photoresist can generate carboxylic substances when reacting with water and chemical reaction can generated between the carboxylic substances and an alkaline developer, and hence the exposed positive photoresist is dissolved; and in a non-irradiated portion, resin and a photosensitive agent react with each other to produce, e.g., bridge, so that non-irradiated portion cannot be dissolved in the developer, and hence the required photoresist pattern can be formed.

Figure 3B:
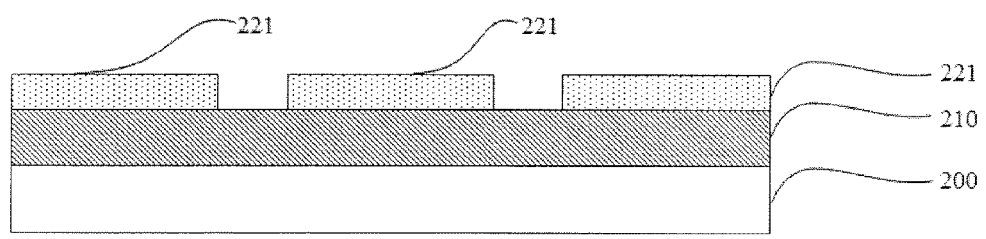

Then, the first photoresist layer 220 obtained after the exposure is subjected to development; photoresist portion whose property are changed after the exposure reacts with a developer, and photoresist portion in a non-irradiated area is retained to form a first photoresist-retained portion 221. In the subsequent etching process, the first photoresist-retained portion 221 is used for protecting the metal there beneath, as shown in FIG. 3b.

Compared with a non-separated mask (herein, it refers to a mask in which a pattern on the mask is consistent with the final pattern which can be formed by one exposure), the density of the pattern on the first mask plate 230 is reduced, so a high-quality pattern can be formed after the exposure, and hence the risk of breakage or short circuit of lines because the pattern on the mask reaches the exposure limit can be avoided.

Figure 3C:
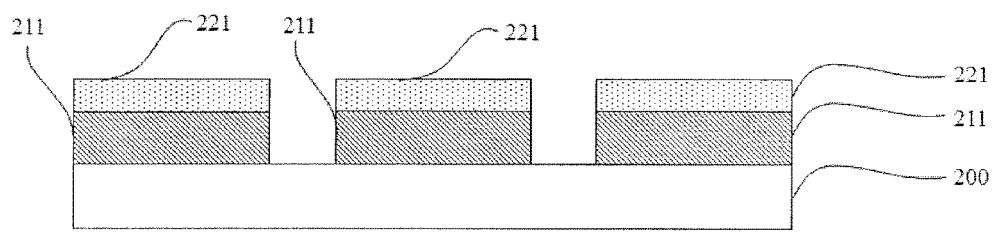

Then, the metal layer 210 is subjected to first etching; an area of the metal layer 210 which is not protected by the photoresist is removed; metal in an area beneath the first photoresist-retained portion 221 is retained; and the intermediate pattern 211 is formed, as shown in FIG. 3c.

The lines in the fan-out area are generally formed by the metal layer. As for the metal layer, wet etching is generally adopted, namely corrosive acid reacts with the area of the metal layer which is not protected by the photoresist, and the metal beneath the area protected by the photoresist is retained, and hence the desired process pattern is formed. However, the etching method herein is not only limited to wet etching. All the etching methods capable of achieving layer etching shall fall within the scope of protection of the present disclosure.

Figure 3D:
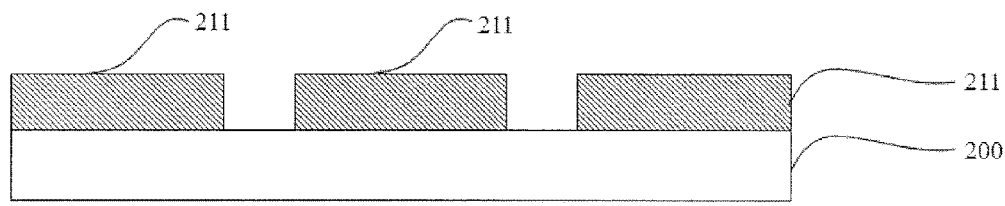

Then, residual photoresist is stripped off, as shown in FIG. 3d. The stripping liquid here is generally a basic organic solvent.

Figure 3E:
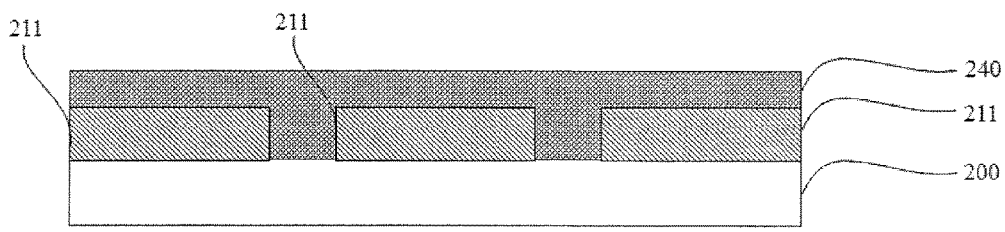

Then, a second photoresist layer 240 is formed on the intermediate pattern 211, as shown in FIG. 3e.

Figure 3F:
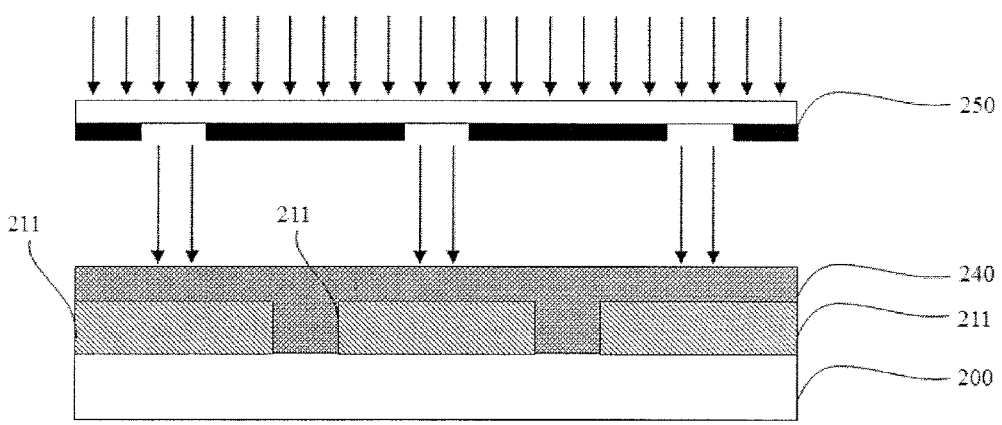

The second photoresist layer 240 is subjected to an exposure via a second mask plate 250, as shown in FIG. 3f. As the final pattern is further formed on the basis of the intermediate pattern 211, during the exposure, the alignment accuracy of the second mask plate 250 and the intermediate pattern 211 needs to be strictly controlled to ensure the quality of the final pattern. Similarly, compared with a non-separated mask, the density of the pattern on the second mask plate 250 is also reduced, so a high-quality pattern can be formed after the exposure, and hence the risk of breakage or short circuit of lines because the pattern on the mask reaches the exposure limit can be avoided.

Figure 3G:
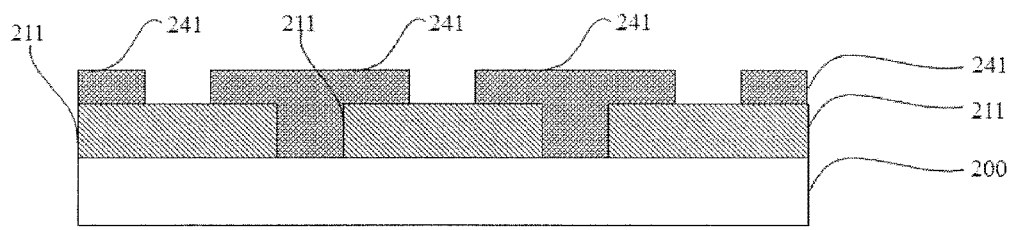

Then, the second photoresist layer 240 obtained after the exposure is subjected to development, so that the photoresist portion whose property is changed after the exposure reacts with a developer, and the photoresist portion in a non-irradiated area is retained to form a second photoresist-retained portion 241 which protects metal beneath in the subsequent etching process, as shown in FIG. 3g.

Figure 3H:
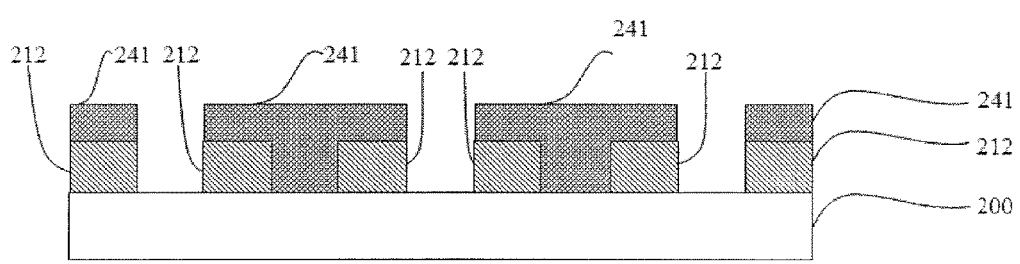
Figure 3I:
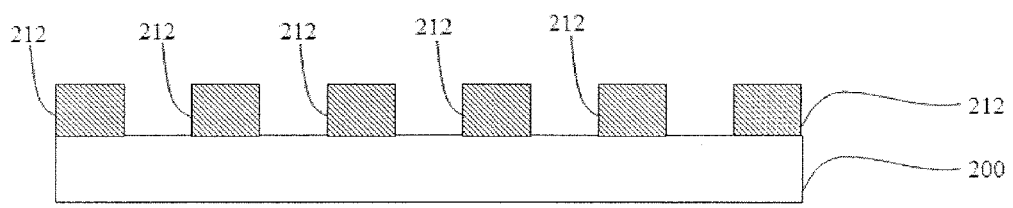

The intermediate pattern 211 is subjected to second etching, as shown in FIG. 3h; and then, the final pattern 212 (namely the line pattern in the fan-out area) is obtained after stripping off the residual photoresist, as shown in FIG. 3i.

It should be noted that although the method provided by at least one embodiment of the present disclosure mainly aims to improve the quality of the pattern in the fan-out area, the method is also applicable to the manufacturing process of other layer patterns and can also effectively improve the exposure accuracy, so as to improve the pattern quality. For instance, the method may he used for manufacturing gate lines, data lines, etc. disposed in the display area.

For instance, in the method for manufacturing the array substrate provided by the embodiment of the present disclosure, the array substrate includes a display area and a fan-out area disposed at the periphery of the display area, and the manufacturing method includes forming a line pattern (e.g., a gate line pattern or a data line pattern) disposed in the display area. The step of forming the line pattern disposed in the display area includes the following steps:

forming a metal layer;

forming an intermediate pattern by performing a first patterning process on the metal layer, in which the intermediate pattern includes a partially formed line pattern; and forming the line pattern disposed in the display area (e.g., a gate line pattern or a data line pattern) by performing a second patterning process on the intermediate pattern.

It should be noted that the characteristics in the process of forming the line pattern in the fan-out area are also applicable to the process of forming the line pattern in the display area. The related description will not be repeated here. Moreover, in the same layer, the line pattern in the display area and the line pattern in the fan-out area may also be formed simultaneously. No limitation will be given here.

Generally, an LCD includes an array substrate and a color filter (CF) substrate which are cell-assembled. The array substrate includes gate lines, data lines, pixel electrodes and TFTs; pixel regions are defined by the gate lines and the data lines which are perpendicular to each other; the TFTs and the pixel electrodes are formed in the pixel regions; the gate lines are configured to provide on or off signals for the TFTs; the data lines are configured to provide data signals for the pixel electrodes; and grey scale display is achieved by the control of the deflection degree of liquid crystals. The array substrate manufactured by the method for manufacturing the array substrate provided by the embodiment of the present disclosure may be applied in an LCD, but not limited thereto, for instance, may also be applied in an OLED display panel.

At least one embodiment of the present disclosure further provides an array substrate, a manufacturing method thereof, a display panel and a display device. The array substrate is manufactured by the manufacturing method provided by at least one embodiment of the present disclosure. In the array substrate provided by at least one embodiment of the present disclosure, high-density lines in fan-out areas are formed by two patterning processes. In the two patterning processes, two separate masks with low pattern density are adopted for exposure, so that the requirement on the resolution of the exposure machine is reduced, and hence the quality of formed patterns after the exposures is higher. Moreover, the array substrate provided by at least one embodiment of the present disclosure can achieve the narrowing of the lines in the fan-out areas. Compared with the process of forming the lines by one exposure in the prior art, the lines in the at least one embodiment of the present disclosure can effectively reduce the risk of breakage and short circuit.

It should be understood that the above embodiments are only exemplary embodiments adopted for the illustration of the principles of the present disclosure, but the present disclosure is not limited thereto. Various modifications and improvements can be made by those skilled in the art without departing from the spirit and essence of the present disclosure and shall also fall within the scope of protection of the present disclosure.

The application claims priority to the Chinese patent application No. 201510374557.6, filed Jun. 29, 2015, the disclosure of which is incorporated herein by reference as part of the application.

The invention claimed is:

1. A method for manufacturing an array substrate, the array substrate comprising a display area and a fan-out area disposed at the periphery of the display area, the manufacturing method comprising forming a line pattern disposed in at least one of the display area and the fan-out area, wherein forming a line pattern disposed in at least one of the display area and the fan-out area comprises the following steps:

forming a metal layer;

forming an intermediate pattern by performing a first patterning process on the metal layer; and forming the line pattern disposed in at least one of the display area and the fan-out area by performing a second patterning process on the intermediate pattern, wherein the step of forming the intermediate pattern by performing the first patterning process on the metal layer includes:

forming a first photoresist layer on the metal layer;

performing an exposure on the first photoresist layer via a first mask plate;

performing a development on the first photoresist layer obtained after the exposure;

performing a first etching on the metal layer; and obtaining the intermediate pattern by stripping off the residual photoresist, wherein the step of forming the line pattern disposed in at least one of the display area and the fan-out area by performing the second pattering process on the intermediate pattern includes:

forming a second photoresist layer on the intermediate pattern;

performing an exposure on the second photoresist layer via a second mask plate;

performing a development on the second photoresist layer obtained after the exposure;

performing a second etching on the intermediate pattern; and obtaining the line pattern disposed in at least one of the display area and the fan-out area by stripping off the residual photoresist, wherein, the first photoresist layer and the second photoresist layer are of negative photoresist layer, or the first photoresist layer and the second photoresist layer are of positive photoresist layer.

2. The manufacturing method according to claim 1, wherein the density of lines in the intermediate pattern is less than the density of lines in the line pattern.

3. The manufacturing method according to claim 1, wherein a width of each line in the intermediate pattern is greater than a width of each line in the line pattern.

4. The manufacturing method according to claim 1, wherein the intermediate pattern includes a partially formed line pattern.

5. The manufacturing method according to claim 1, wherein the array substrate further includes a source/drain layer; and the line pattern disposed in at least one of the display area and the fan-out area is formed in a same layer with a source electrode and a drain electrode in the source/drain layer.

6. The manufacturing method according to claim 1, wherein the array substrate further includes a gate layer; and the line pattern disposed in at least one of the display area and the fan-out area is formed in a same layer with a gate electrode in the gate layer.

7. The manufacturing method according to claim 1, wherein the first photoresist layer is a positive photoresist layer, an area of the first mask plate corresponding to a portion of the metal layer for forming the intermediate pattern is a light-shielding area, and an area of the first mask plate corresponding to a portion of the metal layer to be removed is a transmissive area;
    or the first photoresist layer is a negative photoresist layer, the area of the first mask plate corresponding to the portion of the metal layer for forming the intermediate pattern is a transmissive area, and the area of the first mask plate corresponding to the portion of the metal layer to be removed is a light-shielding area.

8. The manufacturing method according to claim 1, wherein the second photoresist layer is a positive photoresist layer, an area of the second mask plate corresponding to a portion of the intermediate pattern for forming the line pattern is a light-shielding area, and an area of the second mask plate corresponding to a portion of the intermediate pattern to be removed is a transmissive area;
    or the second photoresist layer is a negative photoresist layer, the area of the second mask plate corresponding to the portion of the intermediate pattern for forming the line pattern is a transmissive area, and the area of the second mask plate corresponding to the portion of the intermediate pattern to be removed is a light-shielding area.

9. The manufacturing method according to claim 1, wherein in the step of performing the first etching on the metal layer, the etching method includes dry etching or wet etching.

10. The manufacturing method according to claim 1, wherein in the step of performing the second etching on the intermediate pattern, the etching method includes dry etching or wet etching.

11. An array substrate, manufactured by the manufacturing method according to claim 1.

12. A display panel, comprising the array substrate according to claim 11.

13. The display panel according to claim 12, wherein the display panel includes a liquid crystal display panel or an organic light-emitting diode display panel.

14. A display device, comprising the display panel according to claim 12.

* * * * *